United States Patent
Kawai et al.

(10) Patent No.: US 6,740,598 B2
(45) Date of Patent: May 25, 2004

(54) WIRING LAYER DRY ETCHING METHOD AND SEMICONDUCTOR DEVICE MANUFACTURING METHOD

(75) Inventors: Kenji Kawai, Hyogo (JP); Atsunori Nishiura, Hyogo (JP); Ryoichi Yoshifuku, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/118,375

(22) Filed: Apr. 9, 2002

(65) Prior Publication Data

US 2002/0173150 A1 Nov. 21, 2002

(30) Foreign Application Priority Data

May 18, 2001 (JP) .......................................... 2001-148804

(51) Int. Cl.⁷ ............................................. H01L 21/302
(52) U.S. Cl. ...................... 438/738; 438/706; 438/720; 438/735
(58) Field of Search ................... 438/734, 735, 438/738, 740, 742, 706, 707, 710, 711–712, 714, 720, 725; 216/74, 75, 77, 78, 79, 37

(56) References Cited

U.S. PATENT DOCUMENTS 4,479,850 A * 10/1984 Beinvogl et al. ............ 438/719
5,827,436 A * 10/1998 Kamide et al. ................ 216/77

FOREIGN PATENT DOCUMENTS

JP        4-334021      11/1992
JP      2001-156045    * 6/2001

* cited by examiner

*Primary Examiner*—Carl Whitehead, Jr.
*Assistant Examiner*—Thanhha S Pham
(74) *Attorney, Agent, or Firm*—McDermott, Will & Emery

(57) ABSTRACT

A wiring layer dry etching method is improved not to reduce electrical characteristics of a semiconductor device. A semiconductor substrate on which a mask for patterning a wiring layer is formed is prepared, in which mask is formed on wiring layer (a first step). Affected layers on a surface of the wiring layer are dry-etched and removed (second step). Wiring layer is dry-etched by using mask (third step). When shifting is performed from the second step to the third step, vacuuming is not performed, and continuous discharge is performed.

12 Claims, 7 Drawing Sheets

WIRING LAYER DRY ETCHING METHOD AND SEMICONDUCTOR DEVICE MANUFACTURING METHOD

BACKGROUND OF THE INVENTION

1. Field of the Invention

The present invention generally relates to a wiring layer dry etching method. More particularly, the invention relates to a wiring layer dry etching method improved in that in the processing of a multilayer wiring of, for example, gate electrode, Al, and Cu layers, or in the forming of a plug according to an overall-surface etch back method, a high selectivity to a base is maintained, and the occurrence of etch residues is suppressed. The method thereby enables the provision of a semiconductor device that has high reliability and that does not cause electrical short circuiting. Furthermore, the invention relates to a semiconductor device manufacturing method including steps of the wiring layer dry etching method.

2. Description of the Background Art

Referring to FIGS. 5 to 7, a description will be made regarding a conventional processing method for a polysilicon gate electrode.

FIG. 5 is a schematic view showing the flow of oxygen in the vicinity of a wafer and in a chamber at the time of breakthrough (discharging). FIG. 6 is a schematic view showing the flow of oxygen in the vicinity of a wafer and in a chamber at the time of interstep vacuuming (discharge termination). FIG. 7 is a schematic view showing a conventional wiring layer dry etching method.

Referring to FIG. 5, on a silicon substrate 7, there are sequentially formed a gate insulation film 8, a polysilicon layer 9 used as a gate electrode material, and a silicon oxide film 10 and a resist film (not shown) used as masks during the processing of the gate electrode. FIG. 5 illustrates a semiconductor device in a state where silicon oxide film 10 was etched by using a resist as a mask, polysilicon was exposed, and then, the resist was removed.

Silicon substrate 7 is disposed in a reaction chamber 1. Reaction chamber 1 includes quartz members 2, and is connected to a vacuum pump 4 via a conductance valve 3. In reaction chamber 1, a reactive ion 5 is generated, and residual oxygen 6 remains.

An etching gas used for silicon oxide film 10 includes at least one of $CHF_3$, $CH_2F_2$, $CF_4$, $C_2F_6$, c-$C_4F_8$, c-$C_5F_8$, and $C_4F_6$. The etching gas also includes at least one of $O_2$, CO, $CO_2$, $H_2O$, and $N_2$; and at least one of Ar, He, and Xe. For example, one of mixed gases $CHF_3/O_2/Ar$, $CHF_3/CF_4/Ar$, $C_4F_8/O_2/Ar$, $C_5F_8/O_2/Ar$, or $C_4F_6/O_2/Ar$ is used for the etching gas.

Subsequently, polysilicon layer 9 is etched using silicon oxide film 10 as a mask, and the etching is stopped on gate insulation film 8 (base). After the etching of the silicon oxide film 10 is performed, affected layers (such as a natural oxide film layer, a SiC layer, and a fluorocarbon polymer layer) are formed on the surface of polysilicon layer 9.

To etch polysilicon layer 9, the method performs three steps as described below. As the first step, the method removes affected layers in a step (breakthrough step; the step will be referred to as a "BT step" in the present Specification) for which the selectivity to $Si/SiO_2$ is set to be relatively low (selectivity: 0.8 to 10). In this step, the method uses an etching gas including at least $Cl_2$, for example, $Cl_2$, $Cl_2/O_2$, $Cl_2/CF_4$, $Cl_2/SF_6$, or $Cl_2/HBr$. $HBr/O_2$ may also be used.

As the second step, the method performs a step (polysilicon main etching step; the step will be referred to as an "ME step" in the present Specification) for which the selectivity to $Si/SiO_2$ is set to be relatively high (selectivity: 10 to 40). In this step, the method uses an etching gas, for example, $Cl_2$, $Cl_2/O_2$, $Cl_2/HBr$, or $Cl_2/HBr/O_2$. Since the selectivity to $Si/SiO_2$ increases in proportion to an increase in the flow ratio of $O_2$ to $Cl_2$, an $O_2$ flow ratio in the ME step is set higher than that in the BT step. However, preferably, either in the BT step or the MT step, the $O_2$ flow ratio is set below 20% of the total mass-flow rate. This is because, with the $O_2$ flow ratio higher than 20%, since the surface of the polysilicon layer progresses, etch residues increase; or alternatively, etching does not progress and terminates.

As the third step, when the selectivity to a base is insufficient, the step needs to be shifted to a step (overetching step, which will be referred to as an "OE step" in this Specification) of which selectivity is higher (selectivity: 20 to 100) than that in the ME step, at the same time when gate insulation film 8 is exposed or immediately before the gate insulation film 8 is exposed. For an etching gas, $Cl_2/O_2$, $Cl_2/HBr$, $Cl_2/HBr/O_2$, or $HBr/O_2$ is used. In this case, however, the $O_2$ flow ratio is preferably set higher than or equal to that in the ME step.

Generally, in the ME step, discharge is started after termination of discharge between the BT step and the ME step. In addition, gas vacuuming is performed to stabilize the gas flow rate and pressure that are set at the subsequent ME step.

However, referring to FIG. 6, in reaction chamber 1 where many quartz members 2 are used, oxygen is discharged from quartz members 2 because of sputtering at the BT step. In addition, in the case where $O_2$ is included in gases at the BT step, even in the condition where vacuuming has been performed, the polysilicon surface cleaned at the BT step is oxidized because of residual oxygen. That is, since discharge is stopped, the wafer surface is not sputtered and is therefore oxidized.

Hereinbelow, referring to FIG. 7, after the execution of the ME step in which the selectivity to $Si/SiO_2$ is set to be relatively high, the etching of oxidized surface regions is delayed. Consequently, etching uniformity that can be achieved in the ME step is reduced.

The above causes problems in that etch residues are formed, thereby causing interwiring short circuiting. When the amount of etching is increased to prevent the interwiring short circuiting, however, pass-through is caused in a gate oxide film (base), silicon substrate 7 is thereby damaged. Consequently, electrical characteristics are reduced.

In addition, when ON/OFF discharges occur between the ME step and the OE step (that is, when a gate insulation film begins to be exposed), a problem is caused in that plasma is momentarily formed uneven, and charge-up-attributed damage to gate insulation film 8 is increased.

SUMMARY OF THE INVENTION

The present invention is made to solve the above-described problems, and an object thereof is to provide a wiring layer dry etching method improved not to damage a silicon substrate.

Another object of the present invention is to provide a wiring layer dry etching method improved not to reduce electrical characteristics.

Still another object of the present invention is to provide a wiring layer dry etching method improved not to cause charge-up attributed damage to a gate insulation film.

Still another object of the present invention is to provide a semiconductor device manufacturing method including one of the aforementioned wiring layer dry etching methods.

In a wiring layer dry etching method according to the first aspect of the present invention, first, a semiconductor substrate on which a mask for patterning a wiring layer is formed is prepared, in which the mask is formed on the wiring layer (first step). Affected layers on a surface of the wiring layer are dry-etched and removed (second step: BT step). The wiring layer is dry-etched by using the mask (third step: ME step). When shifting is performed from the BT step to the ME step, vacuuming is not performed, and continuous discharge is performed.

In a wiring layer dry etching method according to the second aspect of the present invention, first, a semiconductor substrate on which a mask for patterning a wiring layer is formed is prepared, in which the mask is formed on the wiring layer (first step). Affected layers on a surface of the wiring layer are dry-etched (second step: BT step). After the BT step, the wiring layer is dry-etched by using the mask (third step: ME step). The wiring layer is overetched under the condition of a high selectivity to a base region when the base region of the wiring layer begins to be exposed or before the base region thereof is exposed (fourth step: OE step). When shifting is performed from the BT step to the ME step and/or when shifting is performed from the ME step to the OE step, vacuuming is not performed, and continuous discharge is performed.

In the wiring layer dry etching method according to the third aspect of the present invention, first, a semiconductor substrate on which a mask for patterning a wiring layer is formed is prepared, in which the mask is formed on the wiring layer (first step). The wiring layer is dry-etched by using the mask (second step: ME step). The wiring layer is overetched under the condition of a high selectivity to a base region when the base region of the wiring layer begins to be exposed or before the base region thereof is exposed (third step: OE step). When shifting is performed from the BT step to the ME step and/or when shifting is performed from the ME step to the OE step, vacuuming is not performed, and continuous discharge is performed.

In addition, in the wiring layer dry etching method according to the fourth aspect of the present invention, preferably, at least one of the BT step, the ME step, and the OE step is performed by using an etching gas including $Cl_2$ and/or HBr.

The above-described wiring layer dry etching method according to the fifth aspect of the present invention is preferably arranged as follows. The BT step is performed by using a pure $Cl_2$ gas, a $Cl_2/O_2$ mixed gas or $Cl_2/F$ containing gas, the ME step is performed by using a pure $Cl_2$ gas or a $Cl_2/O_2$ mixed gas, and the difference in total gas flow rates in the BT step and the ME step is controlled to be lower or equal to ±50%. An $O_2$ flow ratio in the ME step is controlled to be higher than that in the BT step. Concurrently, the $O_2$ flow ratio in each of the BT step and the ME step is controlled not to exceed 20% of the total gas flow rate. The $Cl_2/F$ containing gas includes $Cl_2/CF_4$, $Cl_2/O_2/CF_4$, $Cl_2/CHF_3$, $Cl_2/O_2/CHF_3$, $Cl_2/SF_6$, or $Cl_2/O_2/SF_6$ The above-described wiring layer dry etching method according to the sixth aspect of the present invention is preferably arranged as follows. The BT step is performed by using a gas including one of a pure $Cl_2$, a $Cl_2/O_2$ mixed gas, a $Cl_2/HBr/O_2$ mixed gas, an $HBr/Cl_2$ mixed gas, and an $HBr/O_2$ mixed gas. Each of the ME step and the OE step is performed by using a gas including one of $Cl_2/O_2$, $Cl_2/HBr/O_2$, $HBr/Cl_2$, and $HBr/O_2$. The difference in total gas flow rates in the BT step, the ME step, and the OE step is controlled to be lower or equal to ±50%. An $O_2$ flow ratio in the ME step is controlled to be higher than that in the BT step. Concurrently, the $O_2$ flow ratio in each of the BT step or the ME step is controlled not to exceed 20% of the total gas flow rate.

In addition, the wiring layer dry etching method according to the seventh aspect of the invention is preferably arranged as follows. The BT step is performed by using one of a pure $Cl_2$ gas and a $Cl_2/HBr$ mixed gas. The ME step is performed by using a gas including $Cl_2/HBr/O_2$. The difference in total gas flow rates in the BT step, the ME step, and the OE step is controlled to be lower or equal to ±50%.

Furthermore, the wiring layer dry etching method according to the eighth aspect of the present invention is preferably arranged as follows. The BT step is performed by using a pure $Cl_2$ gas or a $Cl_2/O_2$ gas. The ME step is performed by using a gas including $Cl_2/O_2$. The OE step is performed by using a gas including an $HBr/O_2$ gas. The difference in total gas flow rates in the BT step and the ME step is controlled to be lower or equal to ±50%. An $O_2$ flow ratio in the ME step is controlled to be higher than that in the BT step, and concurrently, the $O_2$ flow ratio in each of the BT step or the ME step is controlled not to exceed 20% of the total gas flow rate. In addition, at least one step using a gas including $Cl_2/HBr/O_2$ is performed between the ME step and the OE step.

The above-described wiring layer dry etching method according to the ninth aspect of the present invention may be arranged as follows. The BT step is performed by using one of a pure $Cl_2$ gas and a $Cl_2/BCl_3$ mixed gas. The ME step is performed by using a gas including $Cl_2/BCl_3$. The difference in total gas flow rates in the BT step and the ME step is controlled to be lower or equal to ±50%. The gas including $Cl_2$ or $Cl_2/BCl_3$ includes a pure $Cl_2$ gas, a $Cl_2/BCl_3$ mixed gas, $Cl_2/BCl_3/Ar$ or $Cl_2/BCl_3/CHF_3$.

In addition, the wiring layer dry etching method according to the tenth aspect of the present invention is preferably arranged such that at least one step of entering a mixed gas including a reducing gas is performed when shifting is performed for each of the BT step and the ME step.

In the wiring layer dry etching method according to the eleventh aspect of the present invention, the wiring layer preferably includes one of polysilicon, WSi/polysilicon, W/polysilicon, W, Ru, Pt, Ir, Ti, TiN, TiW, Al, AlSi, AlSiCu, AlCu, Ta, and TaN. In addition, the polysilicon preferably includes amorphous silicon or doped silicon.

In a wiring layer dry etching method according to the twelfth aspect of the present invention, first, a semiconductor substrate on which a mask for patterning a wiring layer is formed is prepared, in which the mask is formed on the wiring layer. Affected layers on a surface of the wiring layer are dry-etched and removed (BT step). The wiring layer is dry-etched by using the mask (ME step). When shifting is performed from the BT step to the ME step, vacuuming is not performed, and continuous discharge is performed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinbelow, embodiments of the present invention will be described.

First Embodiment

Figure 1:
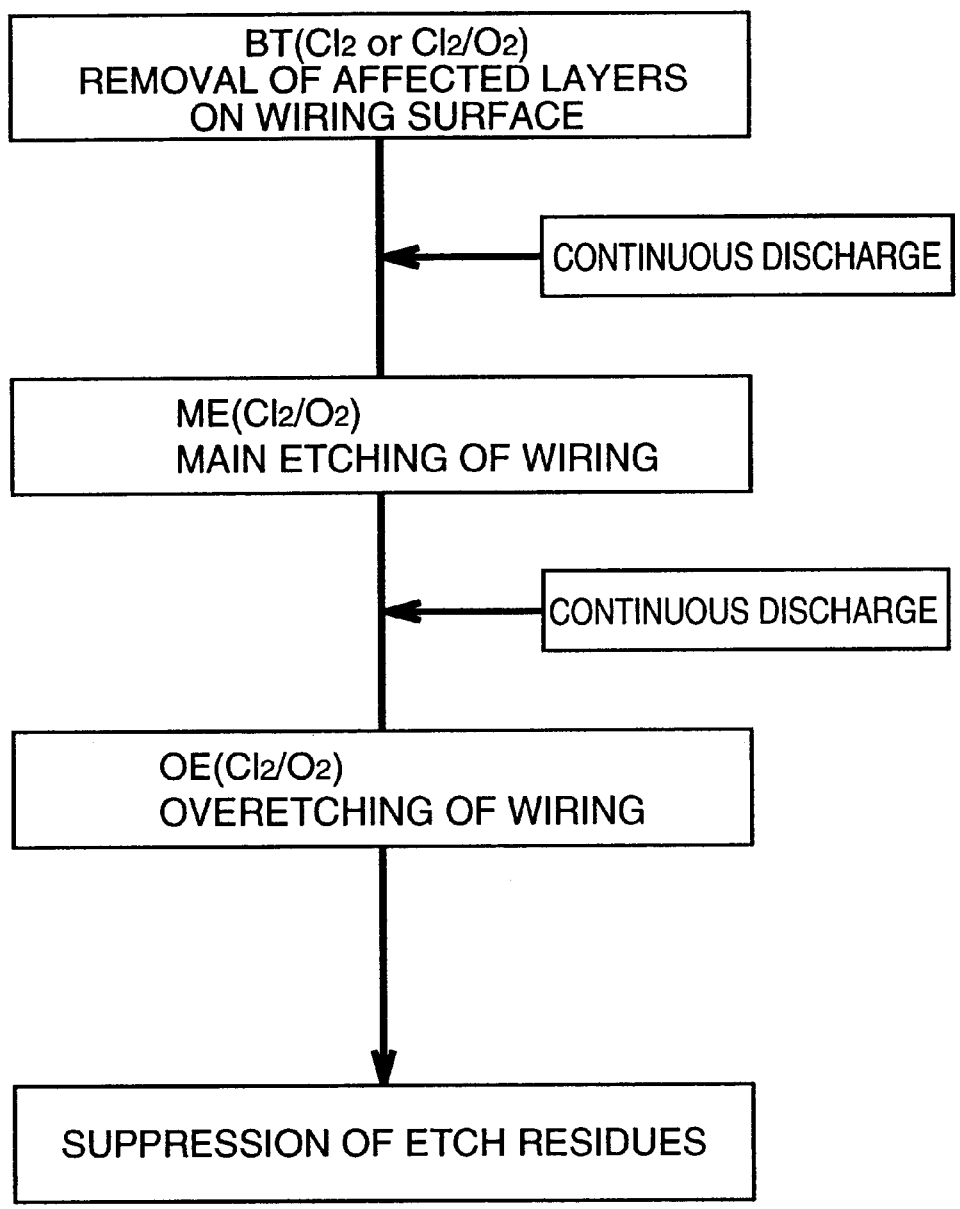
FIG. 1 is a schematic view showing steps of a wiring layer dry etching method according to a first embodiment of the present invention.

FIG. 1 is a schematic view showing steps of a wiring layer dry etching method according to the present embodiment. The figure shows a combination of sequences of the individual steps.

In the present embodiment, different from the conventional method, interstep continuous discharges are performed. In this case, according to sputtering, even when oxygen discharges from quarts member is caused, and oxygen is adhered on a wafer, etchant always collides (sputters) with the wafer. Thereby, adhered oxygen is removed from the wafer. Consequently, the surface of the wafer is not oxidized.

In either the conventional example or the present embodiment, the wiring layer dry etching method has been described with reference to the processing of the polysilicon gate electrode by way of example. However, the present invention is not thereby limited. Conceptual objects of the wiring layer dry etching method includes the formation of conductor films and wirings.

In the present Specification, the conductor film or the wiring includes those formed by using polysilicon, WSi/polysilicon (tungsten polyside), W/polysilicon (tungsten polymetal), W (tungsten), Ru (ruthenium), Pt (platinum), Ir (iridium), Ti (TiN: titanium-nitride; TiW), Al (AlSi, AlSiCu, and AlCu), Cu, and Ta (TaN (tantalum-nitride)).

The polysilicon may either be amorphous silicon or doped silicon.

In addition, the conductor-film etching includes the etching of a silicon substrate (trench etching).

Hereinbelow, a case of a multilayer film will be described. For example, in the etching of a double-layer film of WSi/polysilicon (tungsten polyside), affected layers on the WSi are removed at the BT step ($Cl_2$ process), and a WSi body is etched at the ME step ($Cl_2/O_2$ process). In this stage, the polysilicon is also partly etched. Etching of the remaining portion of the polysilicon and etching in a state where base $SiO_2$ is exposed are performed at the OE step ($Cl_2/O_2$ process).

For the WSi/polysilicon (tungsten polyside) multi-layer film, the interstep continuous discharges are most effective as a countermeasure for etch residues.

Hereinbelow, double-layer-film etching for the double-layer W/polysilicon (tungsten polymetal) will be described.

Since W is etched using a fluorine-based gas (for example, by a $Cl_2/O_2/N_2/CF_4$ process) line, the BT step needs not be performed. From the beginning, W is etched by the ME step and the OE step. Then, polysilicon is etched by the BT step ($HBr/O_2$), the ME step ($HBr/O_2$), and the OE step ($HBr/O_2$).

In the etching of the polysilicon, while processing proceeds in the order of the BT, ME, and OE steps, the $O_2$ flow ratio increases. In the etching of the polysilicon used as part of the wiring in the BT, ME, and OE steps, when interstep continuous discharges are performed, no residue occurs. In this way, the interstep continuous discharges are most effective as a countermeasure for etch residues.

As described above, by causing discharges between the individual steps to minimize etch residues, a semiconductor device can be obtained that has high reliability and that does not cause electrical short circuiting.

Second Embodiment

Figure 2:
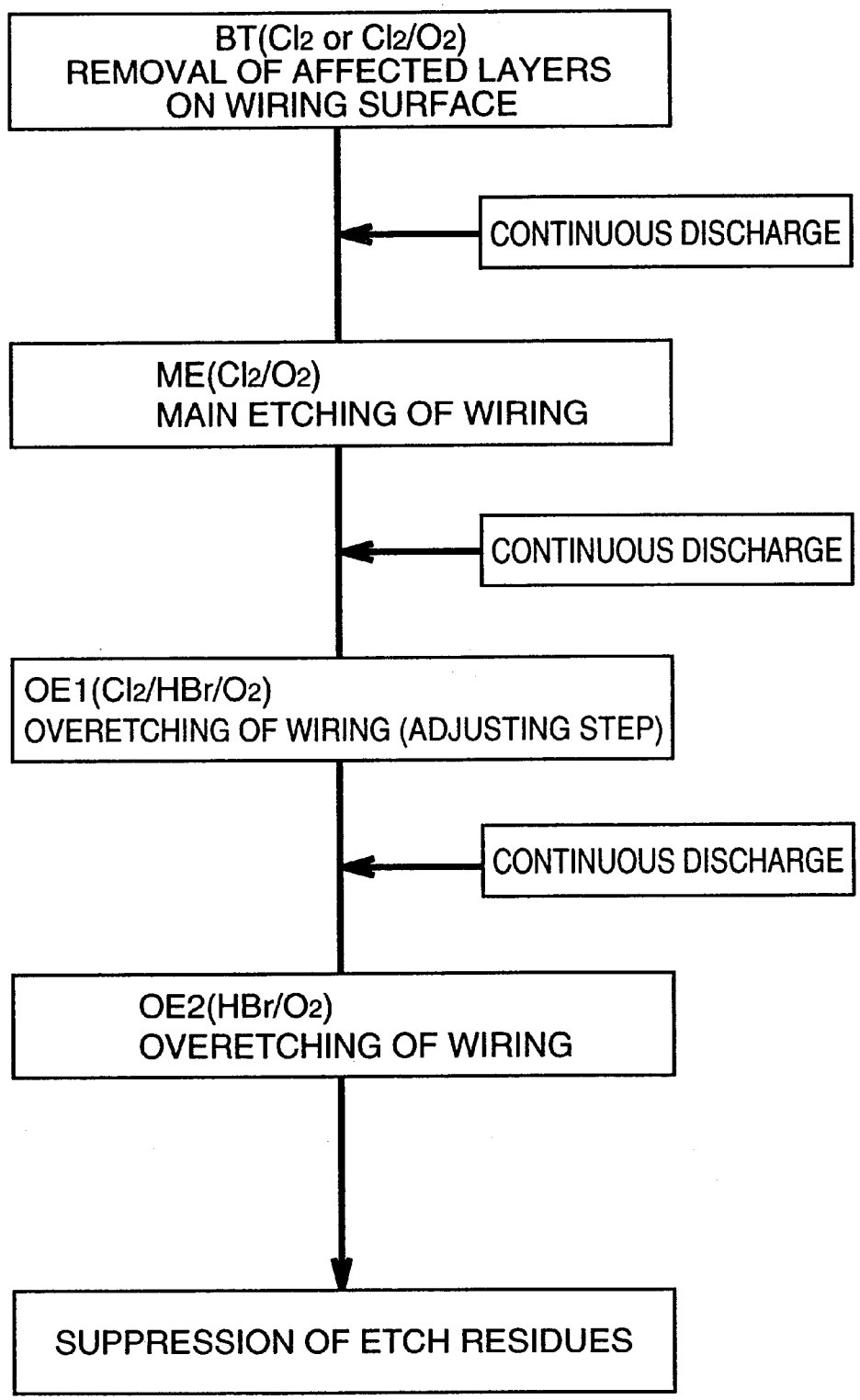
FIG. 2 is a schematic view showing steps of a wiring layer dry etching method according to a second embodiment of the present invention.

FIG. 2 is a schematic view for explaining steps of a wiring layer dry etching method according to a second embodiment. The figure shows a combination of steps and sequences developed by improving those of the first embodiment.

For example, a case is considered in which the $Cl_2/O_2$ mixed gas is used in the ME step, and the $HBr/O_2$ mixed gas is used in the OE step. In this case, since the gases are different from each other, it takes a time before the gas flow rates are stabilized when the step is shifted from the ME step to the OE step. In addition, since the discharges also become unstable, etch characteristics tend to vary. However, the step needs to be shifted as quickly as possible to the OE step that uses the HBr—including gas that allows a high selectivity to be obtained. In this case, at least one etching step using the $Cl_2/HBr/O_2$ gas (OE1 step in FIG. 2) is additionally performed between the ME step and the OE step (between the ME step and an OE2 step in FIG. 2) to cause the gas flow rates to gradually vary. Consequently, interstep discharges are stabilized (that is, the processes are stabilized).

In this way, when gasses used in the individual steps are different from each other, at least one step for causing gas flow rates to gradually vary is additionally performed between the steps to enable interstep continuous discharge to be stabilized. This minimizes etch residues, and consequently, enables the provision of a semiconductor device that has high reliability and that does not cause electrical short circuiting.

Third Embodiment

Figure 3:
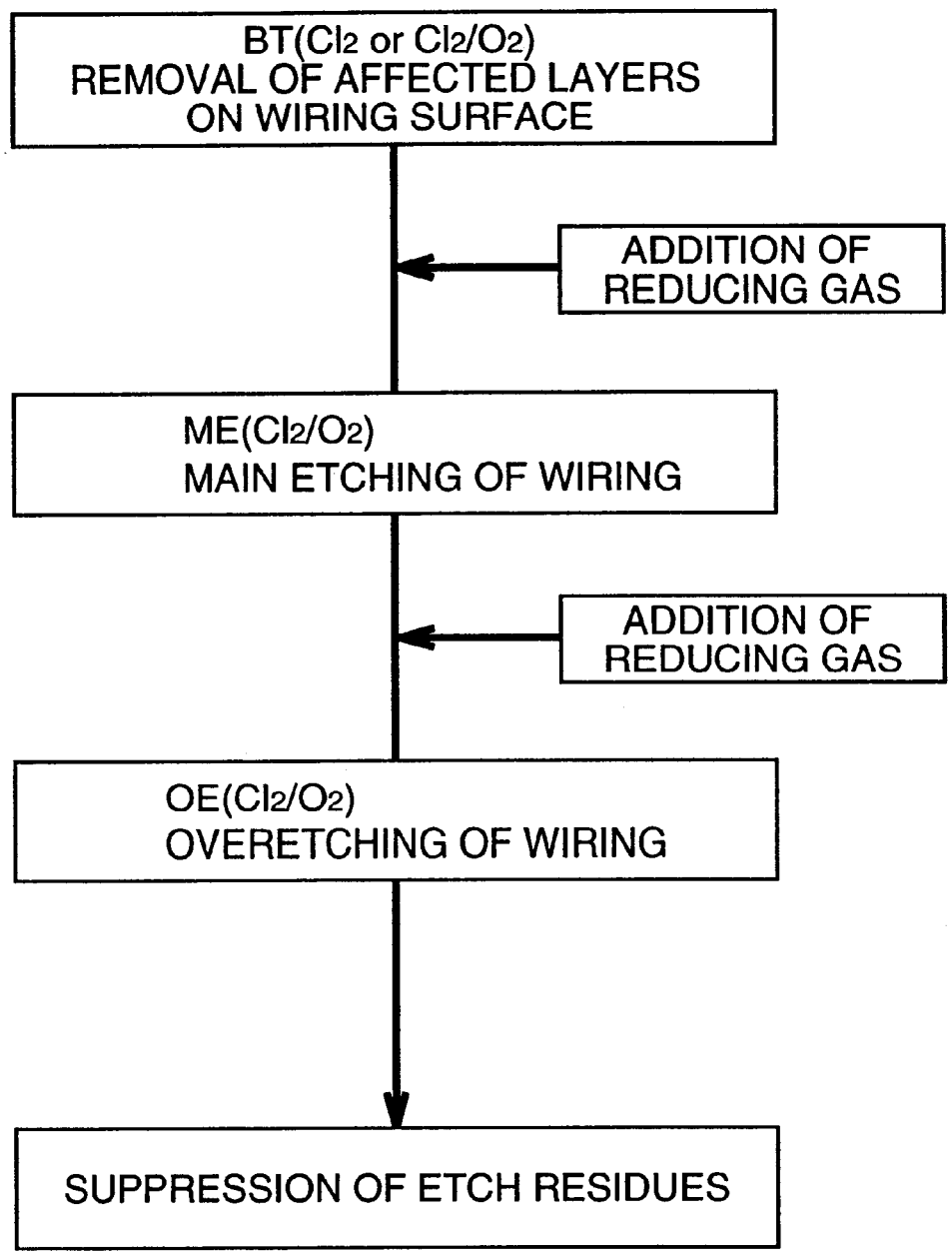
FIG. 3 is a schematic view showing steps of a wiring layer dry etching method according to a third embodiment of the present invention.

FIG. 3 is a schematic view for explaining steps of a wiring layer dry etching method according to a third embodiment. The figure shows the individual steps and a combination of reducing gas introduction sequences.

Figure 4:
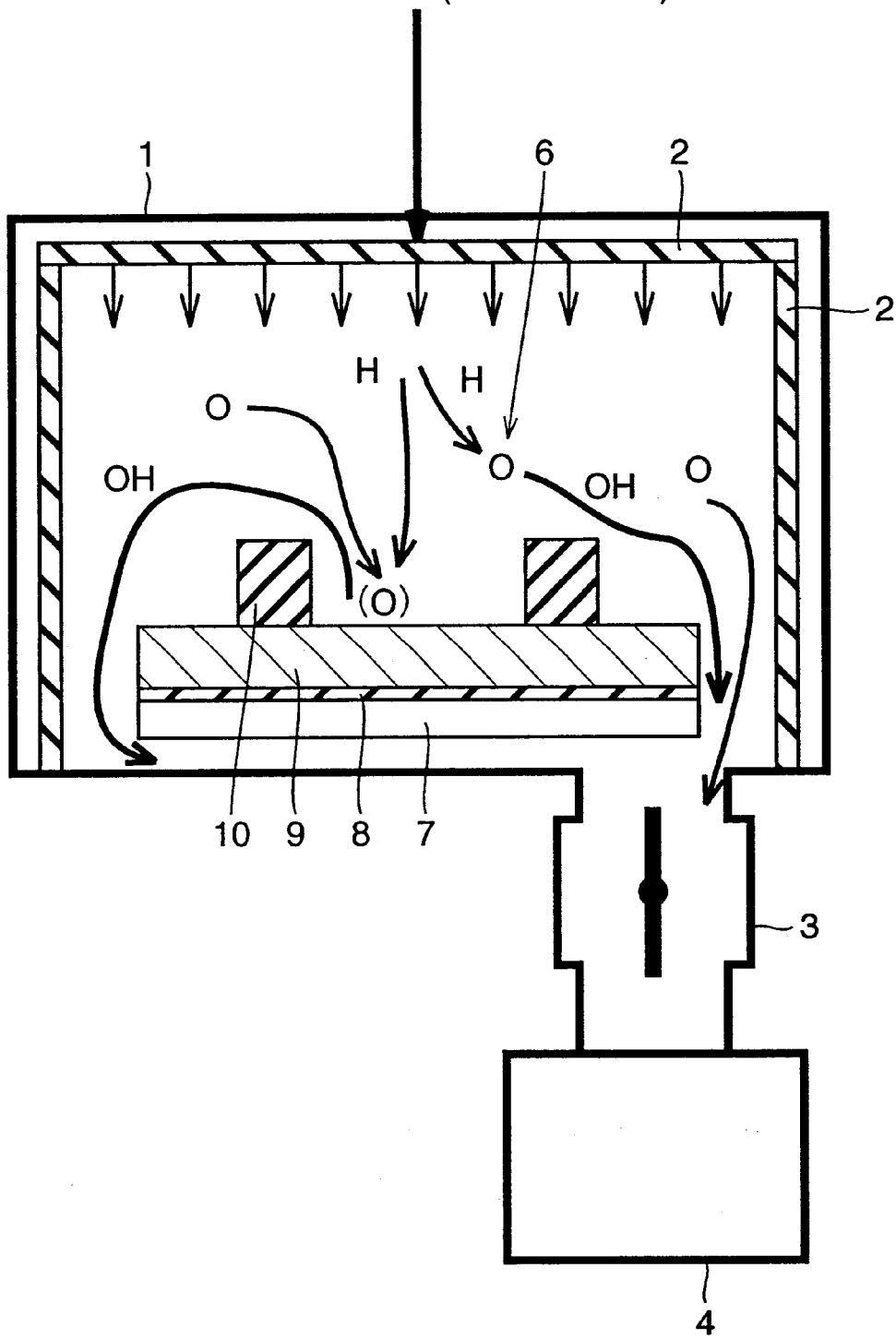
FIG. 4 is a schematic view showing the flow of oxygen in a chamber and in the vicinity of a wafer when a reducing gas is introduced.
Figure 5:
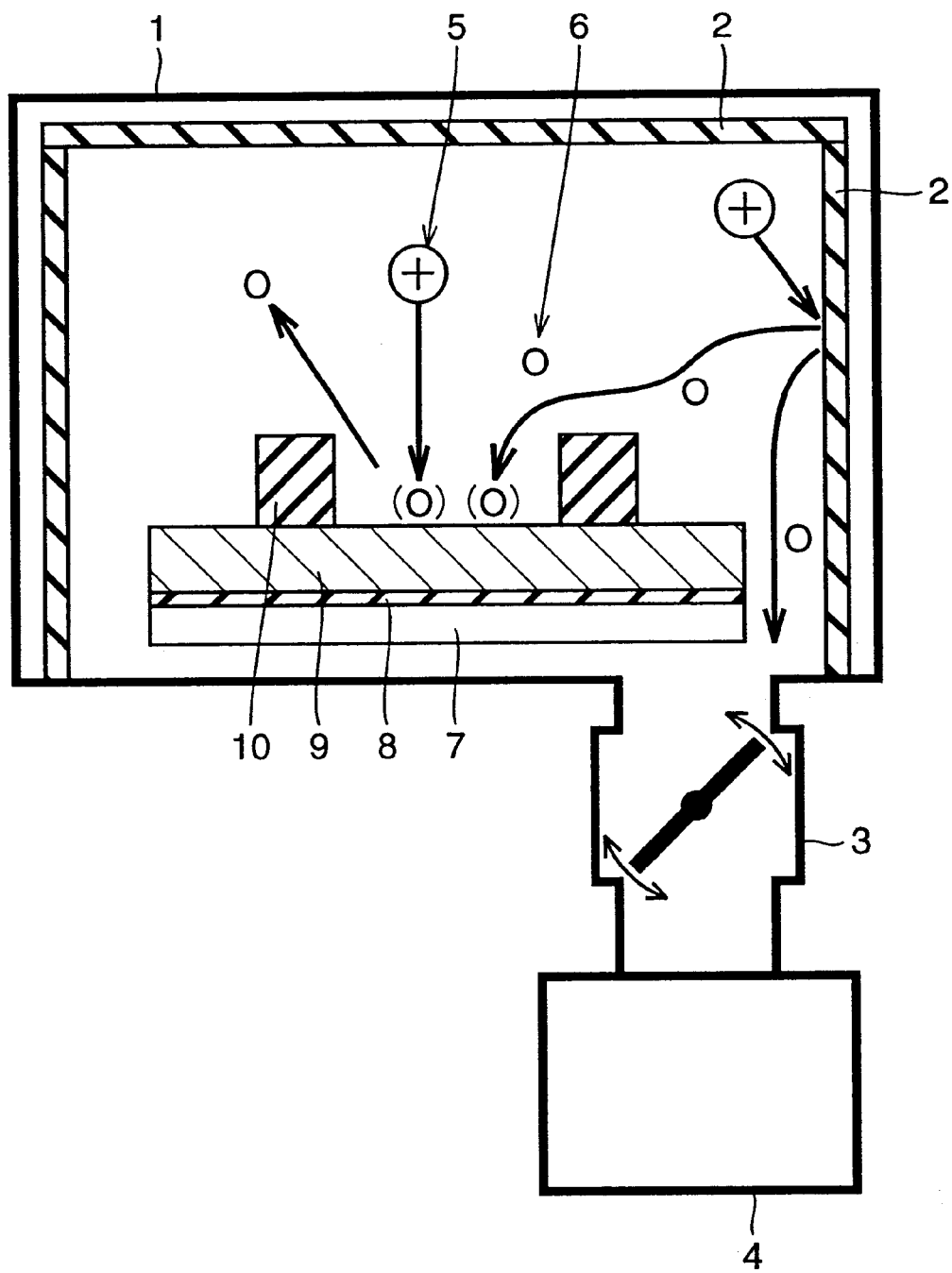
FIG. 5 is a schematic view showing the flow of oxygen in a chamber and in the vicinity of a wafer and in a chamber at the time of breakthrough (or discharging)
Figure 6:
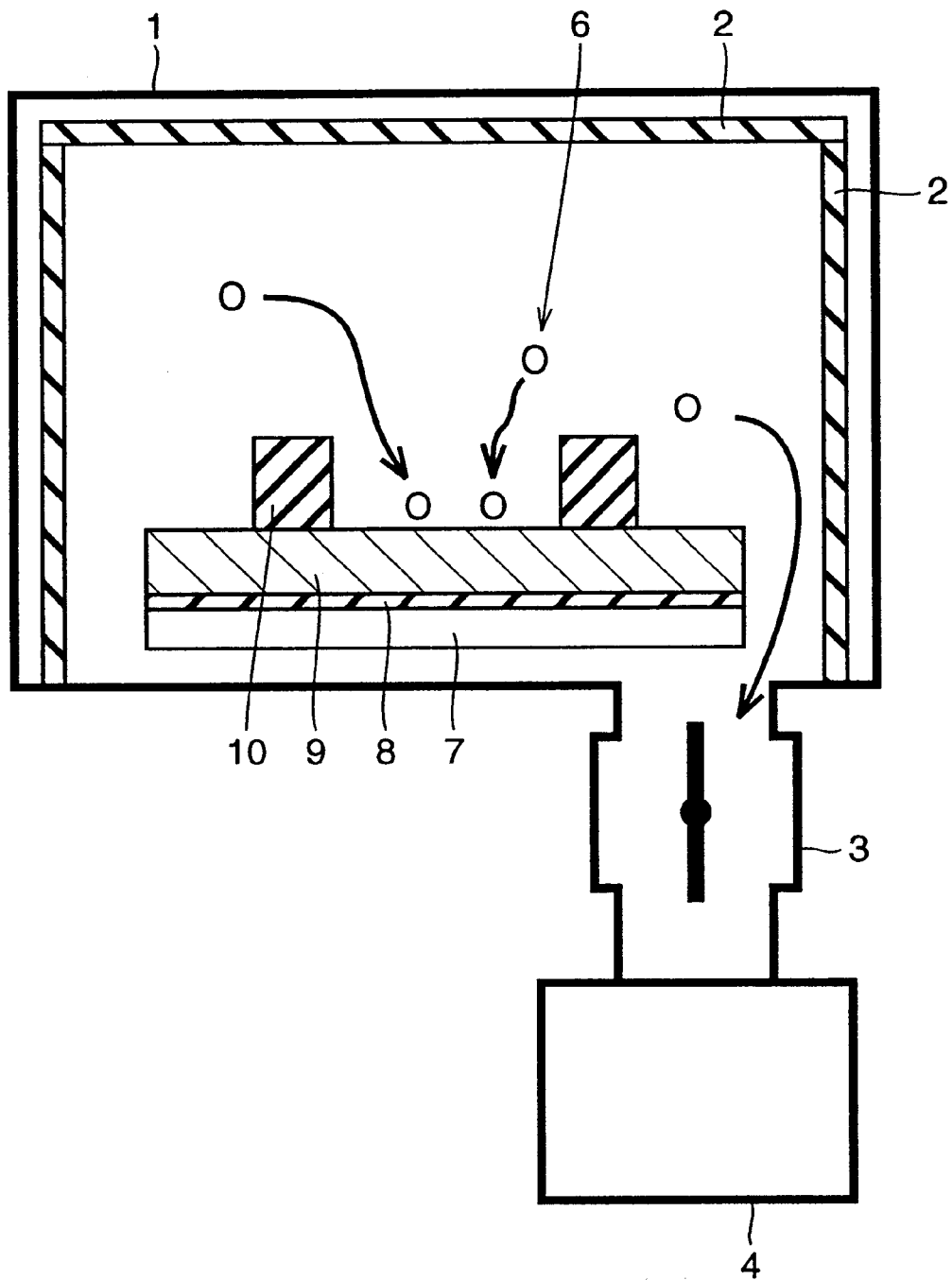
FIG. 6 is a schematic view showing the flow of oxygen in a chamber and in the vicinity of a wafer and in a chamber at the time of interstep vacuuming (or discharge termination)
Figure 7:
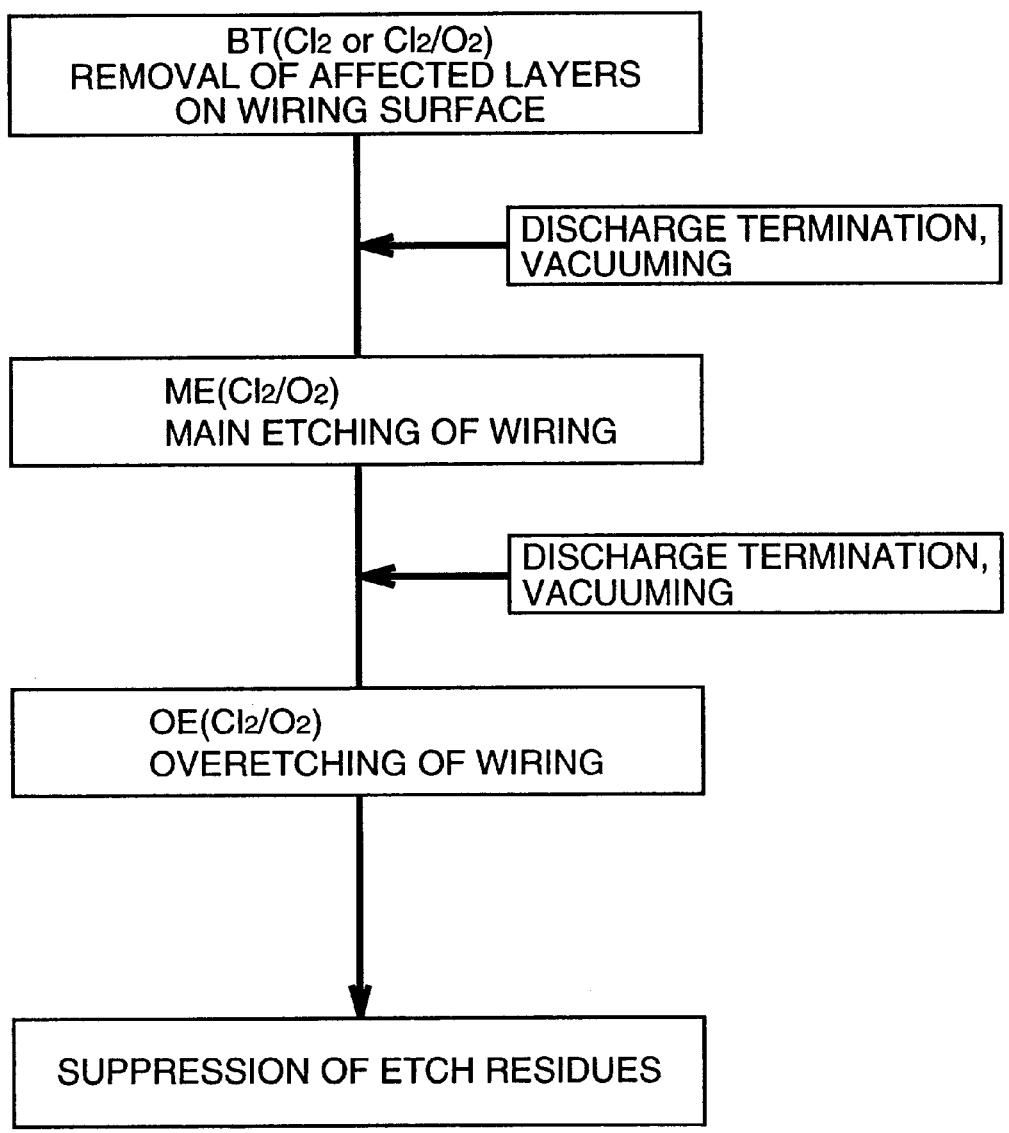
FIG. 7 is a schematic view showing a conventional wiring layer dry etching method.

FIG. 4 is a schematic view showing the flow of oxygen in a chamber and in the vicinity of a wafer when a reducing gas is introduced. FIG. 4 uses the same reference numerals and symbols as those in FIG. 5 for identical or equivalent portions, and description thereof is not repeated.

In FIGS. 3 and 4, a reducing gas such as a hydrogen gas is added between the steps. The reducing gas reduces oxygen floating in reaction chamber 1 and oxygen absorbing adhering on the wafer, and prevents the wafer surface from being oxidized.

In this way, with the reducing gas being added into reaction chamber 1 between the steps, oxidation of the wafer surface can be suppressed. This minimizes etch residues, and consequently, enables the provision of a semiconductor device that has high reliability and that does not cause electrical short circuiting.

In the above embodiment, although the hydrogen is used for the reducing gas, the present invention is not limited thereby. Advantages equivalent to the above can be obtained even with $BCl_3$, CO, $H_2S$, $NF_3$, $CH_4$, or $NH_3$ being used for the reducing gas.

According to the above-summarized present invention, when the wiring layer is dry-etched, the silicon substrate is not damaged. This is advantageous to obtain a semiconductor device in which electrical characteristics are not reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wiring layer dry etching method comprising:
   a first step of preparing a semiconductor substrate on which a mask for patterning a wiring layer is formed, the mask being formed on the wiring layer;
   a second step of dry-etching and removing affected layers on a surface of said wiring layer; and
   a third step of dry-etching said wiring layer by using said mask,
   wherein when shifting is performed from said second step to said third step, vacuuming is not performed, and continuous discharge is performed.

2. The wiring layer dry etching method according to claim 1, wherein:
   said second step is performed by using a pure $Cl_2$ gas, a $Cl_2/O_2$ mixed gas or $Cl_2$/F containing gas;
   said third step is performed by using a pure $Cl_2$ gas or a $Cl_2/O_2$ mixed gas;
   the difference in total gas flow rates in said second step and said third step is controlled to be lower or equal to ±50%; and
   an $O_2$ flow ratio in said third step is controlled to be higher or equal than that in said second step, and concurrently, the $O_2$ flow ratio in each of said second step and said third step is controlled not to exceed 20% of a total gas flow rate respectively for said second step and said third step.

3. The wiring layer dry etching method according to claim 1, wherein:
   said second step is performed by using a gas including $Cl_2$ or $Cl_2/BCl_3$;
   said third step is performed by using a gas including $Cl_2/BCl_3$; and
   the difference in total gas flow rates in said second step and said third step is controlled to be lower or equal to ±50%.

4. The wiring layer dry etching method according to claim 1, wherein at least one step of entering a mixed gas including a reducing gas is performed when shifting is performed for each of said second step and said third step.

5. The wiring layer dry etching method according to claim 1, wherein:
   said wiring layer includes polysilicon, WSi/polysilicon, W/polysilicon, W, Ru, Pt, Ir, Ti, TiN, TiW, Al, AlSi, AlSiCu, AlCu, Ta, or TaN; and
   said polysilicon includes amorphous silicon or doped silicon.

6. A wiring layer dry etching method comprising:
   a first step of preparing a semiconductor substrate on which a mask for patterning a wiring layer is formed, the mask being formed on the wiring layer;
   a second step of dry-etching affected layers on a surface of said wiring layer; and
   a third step of dry-etching said wiring layer by using said mask after said second step; and
   a fourth step of performing overetching for said wiring layer under the condition of a high selectivity to a base region of said wiring layer when the base region begins to be exposed or before a the base region is exposed,
   wherein when shifting is performed from said second step to said third step and/or when shifting is performed from said third step to said fourth step, vacuuming is not performed, and continuous discharge is performed.

7. The wiring layer dry etching method according to claim 6, wherein at least one of said second step, said third step, and said fourth step is performed by using an etching gas including $Cl_2$ and/or HBr.

8. The wiring layer dry etching method according to claim 6, wherein:
   said second step is performed by using a gas including one of a pure $Cl_2$, a $Cl_2/O_2$ mixed gas, a $Cl_2HBr/O_2$ mixed gas, an $HBr/Cl_2$ mixed gas, and an $HBr/O_2$ mixed gas;
   Each of said third step and said fourth step is performed by using a gas including one of $Cl_2/O_2$, $Cl_2/HBr/O_2$, $HBr/Cl_2$, and $HBr/O_2$;
   the difference in total gas flow rates in said second step, said third step, and said fourth step is controlled to be lower or equal to ±50%; and
   an $O_2$ flow ratio in said third step is controlled to be higher or equal than that in said second step, and concurrently, the $O_2$ flow ratio in each of said second step or said third step is controlled not to exceed 20% of a total gas flow rate respectively for said second step and said third step.

9. The wiring layer dry etching method according to claim 6, wherein:
   said second step is performed by using a pure $Cl_2$ gas or a $Cl_2$/HBr mixed gas;
   said third step is performed by using a gas including $Cl_2/HBr/O_2$; and
   the difference in total gas flow rates in said second step, said third step, and said fourth step is controlled to be lower or equal to ±50%.

10. The wiring layer dry etching method according to claim 6, wherein:
    said second step is performed by using a pure $Cl_2$ gas or a $Cl_2/O_2$ gas;
    said third step is performed by using a gas including $Cl_2/O_2$;
    said fourth step is performed by using a gas including an $HBr/O_2$ gas;
    the difference in total gas flow rates in said second step and said third step is controlled to be lower or equal to ±50%;
    an $O_2$ flow ratio in said third step is controlled to be higher than that in said second step, and concurrently, the $O_2$ flow ratio in each of said second step or said third step is controlled not to exceed 20% of a total gas flow rate respectively for said second step and said third step; and
    at least one step using a gas including $Cl_2/HBr/O_2$ is performed between said third step and said fourth step.

11. A wiring layer dry etching method comprising:
    a first step of preparing a semiconductor substrate on which a mask for patterning a wiring layer is formed, the mask being formed on the wiring layer;
    a second step of dry-etching said wiring layer by using said mask; and a third step of performing overetching for said wiring layer under the condition of a high selectivity to a base region of said wiring layer when the base region begins to be exposed or before the base region is exposed, when shifting is performed from said second step to said third step, vacuuming is not performed, and continuous discharge is performed.

12. A semiconductor device manufacturing method comprising:

a first step of preparing a semiconductor substrate on which a mask for patterning a wiring layer is formed, the mask being formed on the wiring layer;

a second step of removing affected layers on a surface of said wiring layer; and a third step of dry-etching said wiring layer by using said mask, wherein when shifting is performed from said second step to said third step, vacuuming is not performed, and continuous discharge is performed.

* * * * *